United States Patent
Terada et al.

(10) Patent No.: US 7,911,285 B2
(45) Date of Patent: Mar. 22, 2011

(54) REFERENCE FREQUENCY CONTROL CIRCUIT

(75) Inventors: Satoshi Terada, Paramus, NJ (US);
Masahiro Obuchi, Oizumi-machi (JP);
Tadahiro Makabe, Oizumi-machi (JP)

(73) Assignees: Sanyo Electric Co., Ltd., Osaka (JP);
Sanyo Semiconductor Co., Ltd.,
Gunma (JP)

( * ) Notice: Subject to any disclaimer, the term of this patent is extended or adjusted under 35 U.S.C. 154(b) by 83 days.

(21) Appl. No.: 12/391,941

(22) Filed: Feb. 24, 2009

(65) Prior Publication Data

US 2010/0214035 A1   Aug. 26, 2010

(51) Int. Cl.
*H03B 5/32* (2006.01)
*H03L 7/06* (2006.01)

(52) U.S. Cl. .................. 331/158; 331/116 R; 331/36 C; 331/177 V

(58) Field of Classification Search .................. 331/1 R, 331/18, 34, 36 C, 44, 116 R, 116 FE, 158, 331/177 V
See application file for complete search history.

(56) References Cited

U.S. PATENT DOCUMENTS

| | | | | |
|---|---|---|---|---|
| 5,994,967 A | * | 11/1999 | Nguyen | 331/1 R |
| 6,271,733 B1 | * | 8/2001 | Alzu et al. | 331/108 D |
| 6,791,421 B2 | * | 9/2004 | Oita | 331/14 |
| 6,856,205 B1 | * | 2/2005 | Groe et al. | 331/17 |
| 6,958,660 B2 | * | 10/2005 | Adduci et al. | 331/158 |

FOREIGN PATENT DOCUMENTS

| | | |
|---|---|---|
| JP | 2004-140817 | 5/2004 |
| JP | 2006-287765 | 10/2006 |

\* cited by examiner

*Primary Examiner* — Robert Pascal
*Assistant Examiner* — Ryan Johnson
(74) *Attorney, Agent, or Firm* — SoCal IP Law Group LLP; Steven C. Sereboff; John E. Gunther

(57) ABSTRACT

A reference frequency control circuit comprising: a frequency voltage converting circuit configured to receive an oscillation signal from an oscillator circuit, and output an output voltage corresponding to a frequency of the oscillation signal, the oscillator circuit being a circuit configured to oscillate at a frequency corresponding to a level of an input signal; and a control circuit configured to control a level of the input signal so that the output voltage is at a predetermined level.

4 Claims, 2 Drawing Sheets

REFERENCE FREQUENCY CONTROL CIRCUIT

BACKGROUND OF THE INVENTION

1. Field of the Invention

The present invention relates to a reference frequency control circuit.

2. Description of the Related Art

Common electronic equipment includes, for example, a crystal oscillator circuit for generating a high precision frequency serving as a reference frequency in the electronic equipment. A crystal oscillator circuit 100 exemplary shown in FIG. 2 is a circuit in which an amplifier circuit 301 including an inverter 203 and a resistor 204 is connected to a resonant circuit 300 including a quartz crystal 200 and capacitors 201 and 202 via a resistor 205 so as to oscillate at a predetermined frequency (see, e.g., Japanese Patent Application Laid-Open Publication Nos. 2004-140817 or 2006-287765). The resistor 205 is a resistor for preventing abnormal oscillation in the crystal oscillator circuit 100.

Since the resonant circuit 300 has a large high Q factor in general, the crystal oscillator circuit 100 is capable of generating a high precision oscillation frequency. However, if the temperature of the surroundings of the crystal oscillator circuit 100 changes, the characteristics of the quartz crystal 200 change, for example, and thus, the resonant frequency of the resonant circuit 300 changes. Since the oscillation frequency of the crystal oscillator circuit 100 is equal to the resonant frequency thereof in general, the oscillation frequency of the crystal oscillator circuit 100 also changes according to the temperature, as a result. Even if the temperature is constant, the resonant frequency varies due to the influence of unevenness in manufacturing the capacitors 201 and 202, for example. Therefore, oscillation frequencies vary among different crystal oscillator circuits 100. Variations in the oscillation frequencies according to the temperature as above can be suppressed by using a TCXO (Temperature Compensated Crystal Oscillator), for example. Variations in the oscillation frequency due to the influence of unevenness in manufacture, however, cannot be suppressed. In addition, the TCXO is expensive in general.

SUMMARY OF THE INVENTION

A reference frequency control circuit according to an aspect of the present invention, comprises: a frequency voltage converting circuit configured to receive an oscillation signal from an oscillator circuit, and output an output voltage corresponding to a frequency of the oscillation signal, the oscillator circuit being a circuit configured to oscillate at a frequency corresponding to a level of an input signal; and a control circuit configured to control a level of the input signal so that the output voltage is at a predetermined level.

Other features of the present invention will become apparent from descriptions of this specification and of the accompanying drawings.

BRIEF DESCRIPTION OF THE DRAWINGS

For more thorough understanding of the present invention and advantages thereof, the following description should be read in conjunction with the accompanying drawings, in which.

DETAILED DESCRIPTION OF THE INVENTION

At least the following details will become apparent from descriptions of this specification and of the accompanying drawings.

Figure 1:
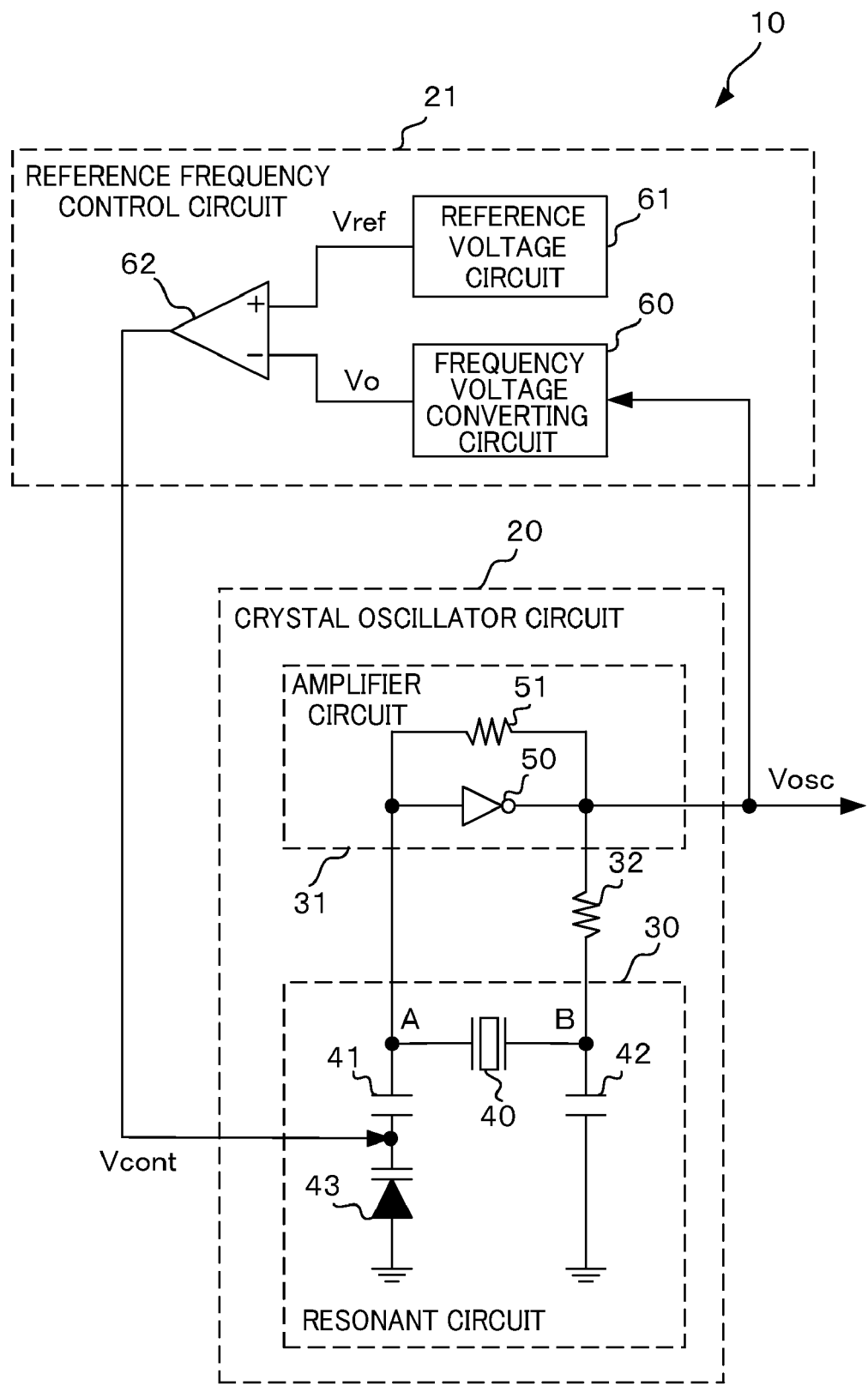
FIG. 1 is a diagram illustrating a reference frequency generating circuit 10 according to an embodiment of the present invention.
Figure 2:
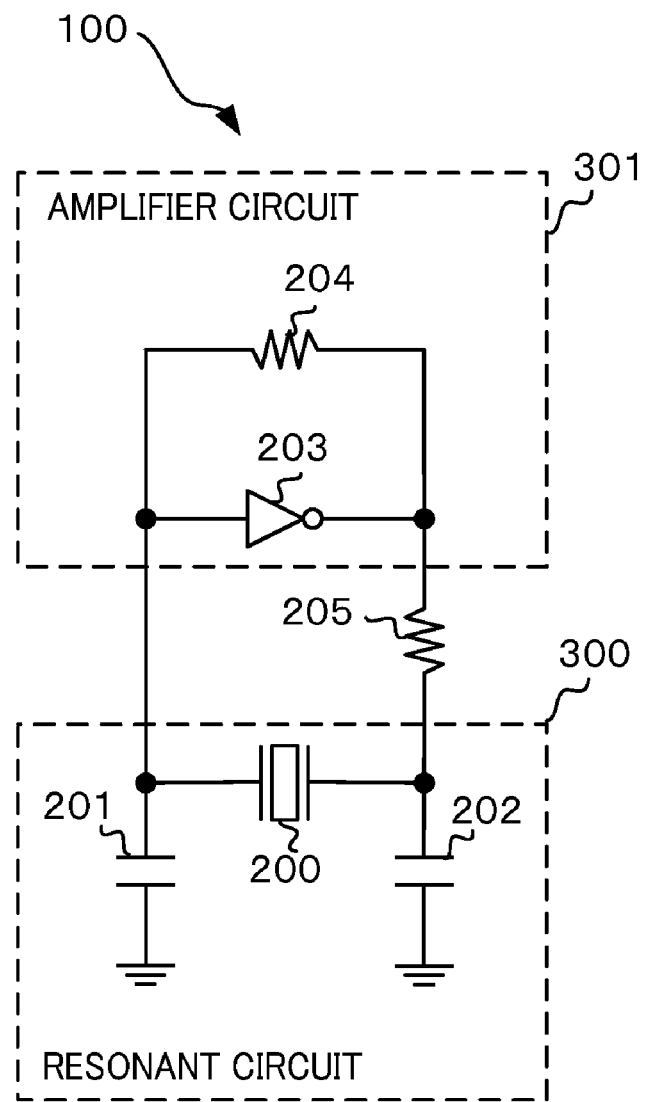
FIG. 2 is a diagram illustrating a configuration of a common crystal oscillator circuit.

FIG. 1 depicts a configuration of a reference frequency generating circuit 10 according to an embodiment of the present invention.

The reference frequency generating circuit 10 generates an oscillation signal Vosc having a predetermined frequency, regardless of temperature change and unevenness in manufacturing elements making up the reference frequency generating circuit 10. The reference frequency generating circuit 10 includes a crystal oscillator circuit 20 and a reference frequency control circuit 21.

The crystal oscillator circuit 20 outputs the oscillation signal Vosc having a frequency corresponding to the level of a control voltage Vcont (input signal) output from the reference frequency control circuit 21, and includes a resonant circuit 30, an amplifier circuit 31, and a resistor 32.

The resonant circuit 30 resonates at a frequency corresponding to the control voltage Vcont, and includes a quartz crystal 40, capacitors 41 and 42, and a varactor 43.

The quartz crystal 40 is an oscillator utilizing the piezoelectric effect of a crystal. In the quartz crystal 40, impedance between terminals thereof changes in characteristics from capacitive to inductive as a frequency between the terminals becomes higher. In an embodiment according to the present invention, the quartz crystal 40 is assumed to be an equivalent circuit having an inductor L, a resistor Rs, and a capacitor Cs connected in series between the terminals, and having a capacitance Cp connected in parallel between the terminals. A node A, which is one end of the quartz crystal 40, is connected to the capacitor 41 and to the varactor 43, while a node B, which is the other end of the quartz crystal 40, is connected to the capacitor 42. The anode of the varactor 43 and one end of the capacitor 42 are grounded, so that the quartz crystal 40, the capacitors 41 and 42, and the varactor 43 are connected in series to form a loop. Assuming that the capacitors 41 and 42 have capacitances C1 and C2, respectively, and the varactor 43 (variable capacitance circuit) has a capacitance C3, the combined capacitance Ct of the capacitors 41 and 42 and varactor 43 is Ct=1/(1/C1+1/C2+1/C3). Here, when the impedance of the above loop is calculated based on the Kirchhoff's Law and the resistor Rs is neglected to obtain a resonant frequency at which the impedance of the loop is zero, a resonant frequency fo is given by a following equation (1) (see, e.g., Japanese Patent Application Laid-Open Publication No. 2004-130817). That is, the resonant circuit 30 resonates at the frequency expressed by the equation (1).

[Equation 1]

$$fo = \frac{1}{\sqrt{LCs}} \times \sqrt{1 + \frac{Cs}{Cp + Ct}} \quad (1)$$

The resonant frequency fo when the control voltage Vcont changes will be described. It is assumed that in the varactor 43 according to an embodiment of the present invention, the capacitance C3 decreases with increase in a bias voltage, which is applied to the cathode of the varactor 43 relative to the voltage of the anode thereof, and increases with decrease in the bias voltage. Accordingly when the capacitances C1 and C2 are constant, the combined capacitance Ct decreases with increase in the control voltage Vcont applied to the cathode, and the combined capacitance Ct increases with decrease in the control voltage Vcont. According to the equation (1), the resonant frequency fo increases with the increase in the control voltage Vcont applied to the varactor 43, and the resonant frequency fo decreases with the decrease in the control voltage Vcont.

The amplifier circuit 31 is a circuit that oscillates the quartz crystal 40, and that includes an inverter 50 and a resistor 51. The resistor 51 is a feedback resistor which is connected between an output terminal of the inverter 50 and an input terminal thereof, so that the inverter 50 and the resistor 51 operate as an inverting amplifier circuit that inverts and amplifies a signal input to the inverter 50. Therefore, the amplifier circuit 31 outputs a signal obtained by shifting the phase of a signal input thereto by 180 degrees, i.e., reversing the signal. Due to an effect of an output resistor (not shown) of the amplifier circuit 31, the resistor 32, and the capacitor 42, the phase of a signal at the node B delays relative to the phase of an output signal from the amplifier circuit 31. For example, when the frequency of the output signal from the amplifier circuit 31 increases, the phase of the signal at the node B delays by 90 degrees relative to the phase of the output signal from the amplifier circuit 31. When the resonant circuit 30 operates at the resonant frequency fo, the capacitive and inductive impedance of the resonant circuit 30 is canceled so that the impedance of the resonant circuit 30 becomes equal to the resistor Rs equivalently connected between the terminals of the quartz crystal 40. As a result, due to the effect of the resistor Rs, the capacitor 41, and the varactor 43, the phase of a signal at the node A delays by 90 degrees relative to the phase of the signal at the node B. In an embodiment of the present invention, the crystal oscillator circuit 20 is designed such that the phase of the signal at the node B delays by 90 degrees relative to the phase of the output signal from the amplifier circuit 31 when the frequency of the output signal from the amplifier circuit 31 becomes equal to the resonant frequency fo. Therefore, at the resonant frequency fo, the output signal from the amplifier circuit 31 is input to the amplifier circuit 31 with a phase delay of 360 degrees. Consequently, the crystal oscillator circuit 20 oscillates at the oscillation frequency fo. In an embodiment according to the present invention, a gain of the amplifier circuit 31 is sufficiently large so that the crystal oscillator circuit 20 oscillates in a stable manner. In an embodiment of the present invention, an output signal from the inverter 50 is the oscillation signal Vosc, which is an output signal from the crystal oscillator circuit 20. An oscillation frequency fosc, which is the frequency of the oscillation signal Vosc, is equal to the resonant frequency fo. The resistor 32 is a resistor for preventing abnormal oscillation in the crystal oscillator circuit 20.

The reference frequency control circuit 21 controls the crystal oscillator circuit 20 so as to keep the oscillation frequency fosc of the crystal oscillator circuit 20 constant, regardless of temperature change and unevenness in manufacturing elements making up the crystal oscillator circuit 20, for example. The reference frequency control circuit 21 includes a frequency voltage converting circuit 60, a reference voltage circuit 61, and an operational amplifier 62 (control circuit).

The frequency voltage converting circuit 60 outputs an output voltage Vo corresponding to the oscillation frequency fosc of the oscillation signal Vosc input thereto. That is the frequency voltage converting circuit 60 receives the oscillation signal Vosc. The frequency voltage converting circuit 60 may be configured with a frequency voltage converting circuit shown in FIG. 1 of Japanese Patent Application Laid-Open Publication No. Hei02-230813, for example. In the frequency voltage converting circuit 60 according to an embodiment of the present invention, the output voltage Vo increases with increase in the oscillation frequency fosc and the output voltage Vo decreases with decrease in the oscillation frequency fosc.

The reference voltage circuit 61 outputs a reference voltage Vref, which is a constant voltage regardless of temperature change. The reference voltage circuit 61 may be configured with a bandgap reference voltage generating circuit shown in FIG. 4 in Japanese Patent Application Laid-Open Publication No. 2004-350290, for example.

The operational amplifier 62 (error amplifier circuit) changes the level of the control voltage Vcont output therefrom corresponding to a difference between the reference voltage Vref input to a non-inverting input terminal thereof and the output voltage Vo input to an inverting input terminal thereof.

An operation will be described of the reference frequency generating circuit 10 when the output voltage Vo is lower than the reference voltage Vref. Since the output voltage Vo is lower than the reference voltage Vref, the control voltage Vcont output from the operational amplifier 62 rises. As a result, the oscillation frequency fosc of the oscillation signal Vosc output from the crystal oscillator circuit 20 increases with the output voltage Vo output from the frequency voltage converting circuit 60. On the other hand, when the output voltage Vo is higher than the reference voltage Vref, the control voltage Vcont output from the operational amplifier 62 drops. As a result, the oscillation frequency fosc of the oscillation signal Vosc output from the crystal oscillator circuit 20 decreases with the output voltage Vo output from the frequency voltage converting circuit 60. Thus, the reference frequency control circuit 21 controls the crystal oscillator circuit 20 so that the output voltage Vo becomes equal to the reference voltage Vref of a predetermined level. As described above, in an embodiment of the present invention, the level of the output voltage Vo becomes equal to the predetermined level of the reference voltage Vref, and therefore, the oscillation frequency fosc is determined based on the reference voltage Vref.

In the reference frequency generating circuit 10 with a configuration described above according to an embodiment of the present invention, the frequency voltage converting circuit 60 outputs the output voltage Vo corresponding to the actual oscillation frequency fosc, and the operational amplifier 62 controls the crystal oscillator circuit 20 so that the output voltage Vo becomes equal to the reference voltage Vref. Therefore the crystal oscillator circuit 20 oscillates at a reference frequency fref, which is determined based on the level of the reference voltage Vref. The reference voltage Vref according to an embodiment of the present invention is constant regardless of temperature change, as described above, and thus, the reference frequency fref is also constant regardless of temperature change. Therefore, even when using a quartz crystal which is not temperature-compensated, for example, it becomes possible to generate a reference frequency, which is constant regardless of temperature change. Even if the capacitances C1 and C2 of the capacitors 41 and 42 varies due to unevenness in manufacture, for example, since the reference frequency fref is determined based on the level of the reference voltage Vref, variations can be suppressed in the reference frequency fref.

In an embodiment of the present invention, even when the characteristics of the quartz crystal 40 or the capacitors 41 and 42 change due to temperature change and unevenness in manufacture, for example, the operational amplifier 62 changes the capacitance of the varactor 43 so that an actual oscillation frequency fosc becomes equal to the reference frequency fref. Therefore, variations can be suppressed in the reference frequency fref.

The operational amplifier 62 outputs to the varactor 43 the control voltage Vcont corresponding to a difference between the output voltage Vo and the reference voltage Vref to change the capacitance of the varactor 43. The oscillation frequency fosc, which changes corresponding to the capacitance of the varactor 43, is fed back to the operational amplifier 62 as the output voltage Vo. Thus, even when temperature change or unevenness in manufacturing elements of the crystal oscillator circuit 20 occurs, for example, since the operational amplifier 62 changes the capacitance of the varactor 43, the crystal oscillator circuit 20 can output the reference frequency fref based on the reference voltage Vref.

The above embodiments of the present invention are simply for facilitating the understanding of the present invention and are not in any way to be construed as limiting the present invention. The present invention may variously be changed or altered without departing from its spirit and encompass equivalents thereof.

While the quartz crystal 40 is used in an embodiment of the present invention, a ceramic resonator may be substituted for the quartz crystal 40, for example.

What is claimed is:

1. A reference frequency control circuit comprising:
   a frequency voltage converting circuit configured to receive an oscillation signal from an oscillator circuit including a crystal oscillator or a ceramic oscillator, and output an output voltage corresponding to a frequency of the oscillation signal, the oscillator circuit being a circuit configured to oscillate at a frequency corresponding to a level of an input signal; and
   a control circuit configured to control a level of the input signal so that the output voltage is at a predetermined level,
   the oscillator circuit including a variable capacitance circuit having a capacitance corresponding to a level of the input signal, the oscillator circuit configured to output the oscillation signal having a frequency corresponding to the capacitance,
   the control circuit including an error amplifier circuit configured to output an error voltage as the input signal to the variable capacitance circuit, the error voltage having a level corresponding to an error between the output voltage and a reference voltage having the predetermined level, and
   the error amplifier circuit changing a level of the error voltage so that the output voltags at the predetermined level.

2. The reference frequency control circuit oscillator of claim 1, wherein the variable capacitance circuit includes a varactor.

3. A reference frequency generating circuit comprising:
   an oscillator circuit including a crystal or a ceramic resonator and a variable capacitance circuit having a capacitance corresponding to a level of an input signal, the oscillator circuit configured to output an oscillation signal having a frequency corresponding to the capacitance;
   a frequency voltage converting circuit configured to receive the oscillation signal from the oscillator circuit, and output an output voltage corresponding to the frequency of the oscillation signal; and
   an error amplifier circuit configured to output an error voltage as the input signal to the variable capacitance circuit, the error voltage having a level corresponding to an error between the output voltage and a reference voltage having a predetermined level, the error amplifier circuit changing a level of the input signal so that the output voltage is at the predetermined level.

4. The reference frequency generating circuit of claim 3, wherein the variable capacitance circuit includes a varactor.

* * * * *

UNITED STATES PATENT AND TRADEMARK OFFICE
CERTIFICATE OF CORRECTION

| | | |
|---|---|---|
| PATENT NO. | : 7,911,285 B2 | Page 1 of 1 |
| APPLICATION NO. | : 12/391941 | |
| DATED | : March 22, 2011 | |
| INVENTOR(S) | : Terada et al. | |

It is certified that error appears in the above-identified patent and that said Letters Patent is hereby corrected as shown below:

Column 6, line 13: replace --voltags-- with "voltage is".

Column 6, line 15: delete "oscillator".

Signed and Sealed this

Seventeenth Day of May, 2011

David J. Kappos
*Director of the United States Patent and Trademark Office*